United States Patent [19]

Smutny

[11] 4,023,100
[45] May 10, 1977

[54] TRANSFORMER FOR D-C SIGNALS

[76] Inventor: Kurt Smutny, Baumschuleweg 7, Erlangen, Germany

[22] Filed: Aug. 28, 1975

[21] Appl. No.: 608,786

[30] Foreign Application Priority Data

Sept. 4, 1974 Germany .......................... 2442223

[52] U.S. Cl. .......................... 324/117 R; 324/99 D; 324/127
[51] Int. Cl.² .................. G01R 33/00; G01R 19/00
[58] Field of Search ............ 324/127, 117 R, 99 D; 340/347 AD; 323/9

[56] References Cited

UNITED STATES PATENTS

| | | | |
|---|---|---|---|
| 3,051,939 | 8/1962 | Gilbert | 324/99 D |
| 3,768,011 | 10/1973 | Swain | 324/117 R |

*Primary Examiner*—Rudolph V. Rolinec
*Assistant Examiner*—Ernest F. Karlsen

[57] ABSTRACT

In the d-c transformer of the present invention a current changing between two maximum values of opposite polarity is impressed on the secondary winding of the transformer. One input of a multiplier is coupled in parallel across the secondary winding and the other input coupled to a current value measuring device in the circuit of the secondary winding with the multiplier providing output signals which are proportional to the d-c signals at the input of the primary side of the transformer.

6 Claims, 3 Drawing Figures

TRANSFORMER FOR D-C SIGNALS

BACKGROUND OF THE INVENTION

This invention relates to a transformer for d-c signals in general and more particularly to such a transformer having a primary winding to which the d-c signal is coupled, a core of magnetically soft material and a secondary winding which is acted upon by an electrical variable signal having a polarity which changes each time the core reaches saturation with a current measuring device associated with the secondary of the transformer.

A d-c transformer of this general nature is disclosed in German Auslegeschrift No. 1,153,452. In this known transformer, a square-wave voltage having a polarity which changes each time saturation is reached is applied to the secondary winding. In order to maintain high transformer accuracy, the magnetic material of the core must have a rectangular hysteresis loop. The switching frequency for the square-wave voltage is determined by the speed with which the hysteresis loop is traversed. This switching frequency must be substantially lower than the switching frequency of the semiconductor elements used in switching the voltage. Otherwise, if the switching frequency is too high, the inertia of the semiconductor elements becomes noticeable leading to an inaccurate transmission of d-c signals. The speed with which the hysteresis loop is traversed is a function of the magnetic flux which must be supplied for magnetizing the core. In order that a given speed will not be exceed the flux must not be lower than a given value. However, what this means, in the last analysis, is that the mechanical size of the magnetic core must not be below a given value. As a result, using this known transformer, requirements demanded in computer technology with regard to physical dimensions cannot be met.

In view of these drawbacks, the need for an improved d-c transformer whose magnetic flux and physical dimensions are independent of the switching frequency and which can be built using a core of any magnetically soft material without regard to a particular hysteresis loop is evident.

SUMMARY OF THE INVENTION

The present invention provides such a d-c transformer. The problems with the prior art transformer are overcome basically by feeding into the secondary winding a current which continuously changes between two maximum values of opposite polarity and by connecting, in parallel with the secondary winding, one input of a multiplier having its other input coupled to a measuring device measuring the current in the circuit of the secondary winding. Furthermore, the multiplier is arranged to have complementary inverse outputs and a switch provided to selectively switch between the two outputs each time the positive or negative maximum value of current is reached. The signal appearing at the output of the multiplier will include a proportionality factor determined by the hysteresis loop of the core material. This can simply be determined by means of a calibration measurement. In accordance with the preferred embodiment the determination of the proportionality factor can be eliminated by coupling an integrating means in parallel with the current measuring device with the intergrating means coupled, after each current cycle, to a control means whose output is coupled to the secondary winding. By using a control device which is in the form of a current regulator having a regulating time which is long compared to the period of a current cycle, cyclic switching of the integrating means which provide an intermediate storage can be avoided.

In accordance with a further embodiment of the present invention the transformer of the present invention can be used to provide conversion of analog d-c input signals into digital output signals. In such an embodiment, the intergrating means comprises a capacitor coupled to a comparator which provides switching outputs to a double throw switch to provide positive or negative switching pulses to the secondary winding. These switching pulses are also fed to first and second counters. The first counter counts all of the switching pulses and the second the switching pulses as a function of polarity.

DETAILED DESCRIPTION OF THE PREFERRED EMBODIMENT

Figure 1:
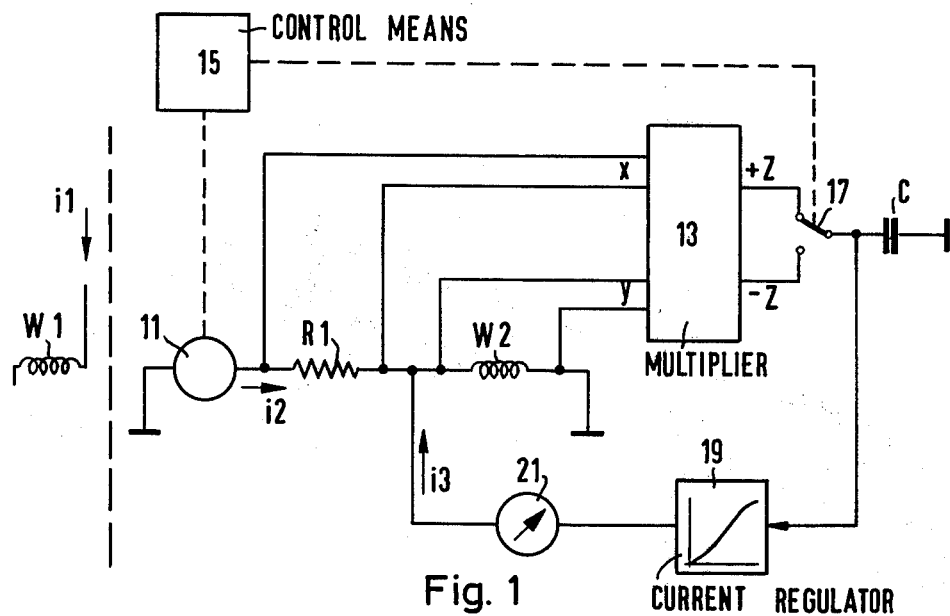
FIG. 1 is a transformer according to the present invention having a current regulator coupled between the secondary winding and the output of the sampling means.

FIG. 1 illustrates a d-c transformer according to the present invention. Shown is a transformer primary winding W1 through which a d-c current $i1$ flows. The secondary of the transformer, designated W2, is coupled in series with a signal generator 11 and a resistor R1. The signal generator 11 impresses a current $i2$ on the secondary winding. This current has a sawtooth shape as illustrated by FIG. 2a. Coupled in parallel across the secondary winding is the input $y$ of a multiplier 13. The second input of the multiplier is coupled across a measuring resistor R1. The multiplier 13 is provided with complementary outputs designated $+Z$ and $-Z$. In other words, outputs of equal magnitude but opposite polarity are provided from the multiplier 13. These are coupled through a double throw switch 17 to one terminal terminal of a capacitor C having its other terminal grounded. Capacitor C forms an integrating means for the output current of the positive or negative output of the multiplier. A control means designated 15 is used both for controlling the signal generator 11 and for switching the switch 17. It is arranged to carry out the necessary switching when the current $i2$ of the current generator 11 has reached its positive or negative maximum value. For example, signal generator 11 can be a conventional integrating device to which fixed positive and negative voltages can be coupled through FET switches, for example. In such a case control 15 could include comparators for sensing the positive and negative maximum values and a flipflop which was set and reset by the comparator outputs. The flipflop outputs would then be used to control the FET switches in signal generator 11. Switch 17 may also be a pair of FET switches controlled by the same outputs.

The terminal of capacitor C which is coupled to the switch 17 is also coupled as the actual value input to a control device in the form of a current regulator 19. This current regulator has its output coupled through a current measuring device, i.e. an ammeter 21, to the secondary winding W2. The current regulator 19 will in conventional fashion, comprise an integrating amplifier controller. Regulator 19 causes the secondary winding W2 to be subjected to a compensating current $i3$. The ammeter 21 indicates the value of this compensating current.

Figure 2:
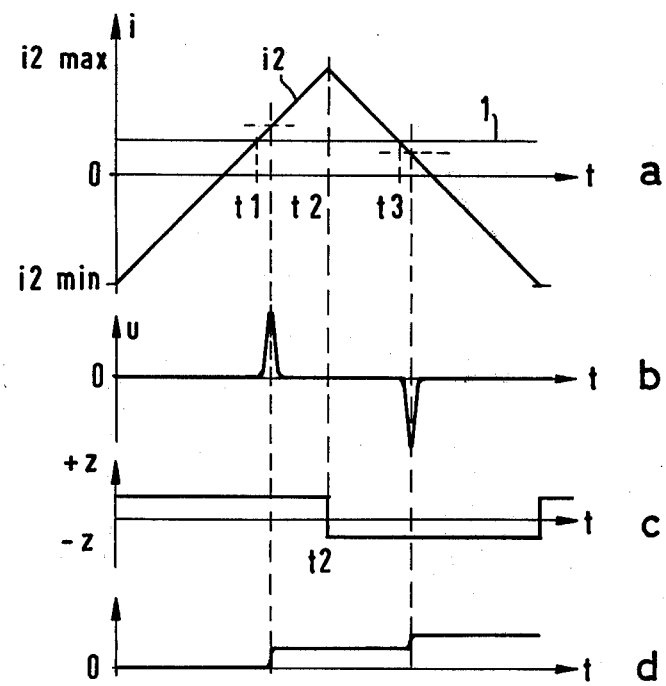
FIG. 2a illustrates the wave shape of the current impressed on the secondary winding.
FIG. 2b illustrates the wave shape of the voltage induced in the secondary winding.
FIG. 2c illustrates the switch positions of the double throw switch.
FIG. 2d illustrates the wave shape of the voltage of the capacitor coupled to the output of the multiplier.

The operation of the circuit can best be understood with reference to FIG. 2. In FIG. 2a the sawtooth wave shape of the current $i2$ provided by the generator 11 is shown. As illustrated it alternates between a positive and negative maximum value, i.e. between $i_{2max}$ and $i_{2min}$. The line 1 which is drawn parallel to the time axis represents the difference between the current $i1$ flowing in the primary winding W1 and the compensating current $i3$. In a steady state condition these two currents will be equal. That is to say, once the circuit has settled out and is providing a proper output indication on the ammeter 21, its reading of the current $i3$ will accurately represent the current $i1$ flowing through the winding W1. Since line 1 represents the difference between these two currents, at steady state it will be coincident with the time axis. As illustrated on the figure, however, there is a difference between the two, i.e. the figure illustrates a condition prior to steady state. At the time $t1$ and the current $i2$ is equal to the difference between the current $i1$ and the compensation current $i3$. At time $t2$ the current $i2$ has reached its positive maximum value and its polarity is reversed. At the time $t3$ there is again equality between the current $i2$ and the difference the current $i1$ and the compensating current $i3$. FIG. 2b illustrates voltage pulses which occur at the secondary W2. The voltage pulses shown on the figure were obtained for material having a rectangular hysteresis loop. The maximum point of the voltage pulses is displaced by one half the width of the hysteresis loop relative to the intersection of the curve representating the current $i2$ with the line 1. If a magnetic material with another shape of hysteresis loop is used in the core then the voltage pulses in the secondary winding W2 will have a broader and flatter shape. These pulses are one input of the multiplier 13. A shown by FIG. 2c, during the rising portion of the triangular wave the switch 17 is switched to the +Z output of the multiplier 13. Upon occurrence of the pulse on its X input the output across the winding W2 is multiplied by the voltage across R1 and the result provided as an output on +Z. Prior to that time the voltage across secondary W2 was zero and thus the multiplier output was zero. As shown by FIG. 2d, the capacitor C shortly reaches this same voltage. At the time $t2$ in response to an output from the control means 15 the switch 17 is switched to the -Z output of the multiplier. At the time $t3$ when the waveform of the current $i2$ crosses the line 1, a negative pluse occurs causing an output from the mulitiplier which is negative but which, when inverted, is positive causing a further charging of the capacitor C as shown on the waveform of FIG. 2d.

Operation of the transformer is as follows: the current $i1$ flowing in the primary winding W1 premagnetizes the material of the core. Prior to reaching steady state of the transformer, the absolute value of the compensating current $i3$ which is fed from the current regulator into the secondary winding is larger or smaller than the current $i1$ flowing in the primary winding W1. As a result, line 1 of FIG. 2a is shifted up or down with respect to the time axis. A voltage pulse always occurs at the secondary winding W2 at the point where the curve of the current $i2$ and the line 1 intersect, i.e. $i2$ compensates $i1$ and $i3$ for zero magnetic force on the core. A voltage corresponding to the current $i2$ is provided to the multiplier 13 by means of the measuring resistor R1. When the voltage pulse occurs at the $y$ input the product of the voltages present appears at the two outputs +Z and -Z of the multiplier. Since the voltage pulses of the secondary winding are always the same height, the signal appearing at the output of the multiplier 13 is proportional to the current $i2$ at the time of pulse. This in turn is proportional to the difference between $i1$ and $i3$. As a result the capacitor C is always charged in proportion to the current $i2$. Since the output of the multiplier 13 will only appear for a short period of time during the pulses from the winding W2, the capacitor will change its voltage only in this period and keep it otherwise. The capacitor voltage is fed to the current regulator 19 to cause its output to increase or decrease thereby increasing or decreasing the current $i_3$. At the point where $i_3$ equals $i_1$ the line 1 of FIG. 2a will be coincident with the time axis and $i2$ at the time of the pulses will be zero and thus the output of the multiplier will be zero. With a zero input the current capacitor, which as noted above will be used as an integrating amplifier, will continue to have the same output. Through the alternate switching of the switch 17, and the use of the positive and negative outputs of the multiplier, the capacitor C is always charged in the same direction despite the alternating polarity of the voltage pulse at the secondary winding.

Figure 3:
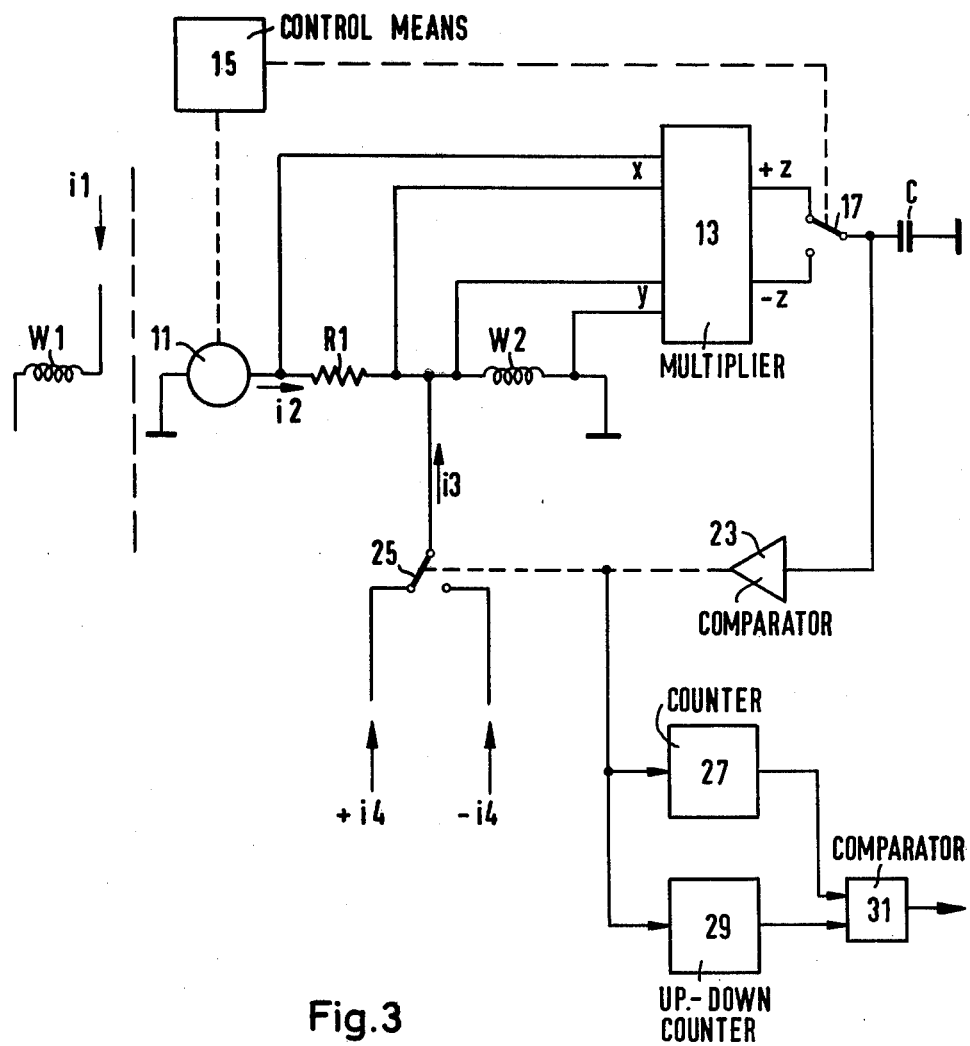
FIG. 3 is a circuit-block diagram of an analog to digital converter according to the present invention.

FIG. 3 illustrates an analog to digital converter constructed using the d-c transformer of the present invention. In this figure parts which are identical to those of FIG. 1 are given the same reference numerals and will not be again described. The primary difference between what is shown on this figure and what is shown on FIG. 1 is that rather than providing a current regulator and meter in a feedback path from the capacitor to the winding W2 there is instead a comparator 23, the output of which controls a switch 25. At the end of each full cycle of current $i2$ the comparator 23 is enabled to output a positive or negative switching pulse depending on the polarity of the voltage on capacitor C. Depending on the polarity of the switching pulse, the switch 25 couples the input $i3$ to the winding W2 either to a positive current $+i4$ or a negative current $-i4$. The cyclic switching of positive and negative reference currents is such that the mean value of the compensating current is equal to the current $i1$ flowing in the primary winding W1. From this it follows that the excessive cycles during which the positive reference current $+i4$ is connected to the secondary W2 over those cycles during which the negative reference current $-i4$ is connected to the secondary winding W2, referred to the total number of cycles in a given period of time, is equal to the ratio of the current $i1$ flowing in the primary winding W1 to the reference current $i4$.

It is this relationship which permits using the arrangement shown as an analog to digital converter. To accomplish this conversion first and second counters 27 and 29 are coupled to the output of the comparators 23. The first counter, 27 counts all the switching pluses which occur at the comparator 23 up to a predetermined number. The second counter counts the switching pulses as a function of their polarity. In other words, the second counter 29 is an up-down counter. It counts up for positive switching pulses and down for negative switching pulses. By so doing it forms the difference between the positive and negative switching pulses. After a predetermined number of switching pulses e.g. when the counter 27 is full, the outputs of the two counters are provided to a comparator 31 which provides at its output a digital quantity proportional to the ratio of the current $i1$ to the reference current $i4$.

In the transformer of the present invention, the speed with which the hysteresis loop is traversed depends on the slope of the current $i2$ which is impressed on the secondary winding W2. The switching frequency for the current $i2$ can be freely chosen. In the transformer of the present invention the design limits for the converter core which in prior art converters are determined by the magnetic flux which is to be supplied, are eliminated. As a result a converter can be constructed with a very small core so as to have small physical dimensions.

Any magnetically soft material having any hysteresis loop can be used for the core of the transformer of the present invention. A compensating current $i3$ is always adjusted so that it becomes equal to the current $i1$ flowing in the primary winding W1. If a material with a rectangular hysteresis loop is used for the core of the converter, a multiplier 13 which merely checks at the input connected to the secondary winding W2 whether the voltage pulse occurring at that point is zero, positive or negative can be used.

The use of a sawtooth current $i2$ has certain advantages because of the linearity of the current wave shape. However, any other current alternates continuously between a positive and negative maximum can be impressed on the secondary winding W2. For example, a sinusoidal or cosine current can be used instead. In addition, it is possible to connect the control means 19 by means of a cyclically controlled switch to the capacitor C. With such an arrangement, the compensating current $i3$ will remain constant during a cycle of the current $i2$ and can then be readjusted between cycles.

These and other modifications may be made without departing from the spirit of the invention, which is intended to be limited solely by the appended claims.

I claim:

1. In a transformer for d-c signals having a primary winding through which a d-c current flows, a core of magnetically soft material and a secondary winding which is acted upon by an electrical variable having a polarity which changes if the core reaches saturation, with a current measuring device coupled to the secondary, the improvement comprising:
   a. means coupled to the secondary winding to cause it to be acted upon by a current which continuously changes between two maximum values of opposite polarity;
   b. a measuring resistor in series with the secondary winding;
   c. a multiplier having one input coupled across said measuring resistor and another input coupled across said secondary winding, said multiplier providing two complementary outputs;
   d. a double-throw switch alternately coupling the current measuring device to one and the other complementary outputs of said multiplier; and
   e. means to switch said double-throw switch from one output to the other output each time a positive or negative maximum value of current is reached.

2. Apparatus according to claim 1 wherein the current impressed on said secondary winding is a sawtooth shaped current.

3. Apparatus according to claim 1 and further including integrating means coupled in parallel to said current measuring means and further including a current regulator obtaining its input from said intergrating means and providing an output through said measuring means to said secondary winding, whereby said current regulator is connected to said integrating means after each full cycle.

4. Apparatus according to claim 3 wherein said current regulator has a response time which is long as compared to the period of a current cycle.

5. Apparatus according to claim 3 wherein said integrating means comprises a capacitor and further including:
   a. a comparator coupled to said capacitor said comparator providing an output pulse after each current cycle the polarity of said output pulse depending on the polarity of the charge on said capacitor;
   b. posisitive and negative reference current supplies;
   c. a switch selectively coupling said positive and negative reference supplies to said secondary winding in response to the outputs of said comparator;
   d. a first counter coupled to the output of said comparator to count all pulses output thereby; and
   e. a second counter for counting pulses from said comparator as a function of polarity.

6. Apparatus according to claim 5 wherein said second counter is an up-down counter increasing its count for positive pulses and decreasing its count for negative pulses.

* * * * *